US009103893B2

(12) United States Patent
Kanzaki (10) Patent No.: US 9,103,893 B2
(45) Date of Patent: Aug. 11, 2015

(54) VOLTAGE MONITOR SEMICONDUCTOR DEVICE, BATTERY PACK, AND ELECTRONIC DEVICE EMPLOYING BATTERY PACK

(75) Inventor: Daisuke Kanzaki, Tokyo (JP)

(73) Assignee: RICOH ELECTRONIC DEVICES CO., LTD., Osaka (JP)

( * ) Notice: Subject to any disclaimer, the term of this patent is extended or adjusted under 35 U.S.C. 154(b) by 632 days.

(21) Appl. No.: 13/414,967

(22) Filed: Mar. 8, 2012

(65) Prior Publication Data

US 2012/0229091 A1  Sep. 13, 2012

(30) Foreign Application Priority Data

Mar. 11, 2011 (JP) ................................ 2011-054163

(51) Int. Cl.
*G01R 31/36* (2006.01)
*H02J 7/00* (2006.01)

(52) U.S. Cl.
CPC .......... *G01R 31/3658* (2013.01); *G01R 31/362* (2013.01); *H02J 7/0021* (2013.01); *H02J 2007/004* (2013.01); *H02J 2007/0037* (2013.01)

(58) Field of Classification Search
CPC .................. H02J 7/0026; H02J 7/0021; H02J 2007/0037; H02J 2007/0039; H02J 2007/004; G01R 31/3658
USPC ......................................... 320/112; 324/433
See application file for complete search history.

(56) References Cited

U.S. PATENT DOCUMENTS

| 7,301,306 B2 * | 11/2007 | Zhang | 320/134 |
| 7,816,890 B2 * | 10/2010 | Goto | 320/134 |
| 2001/0017534 A1 * | 8/2001 | Haraguchi et al. | 320/134 |
| 2006/0098366 A1 * | 5/2006 | Mashiko | 361/90 |
| 2006/0187602 A1 * | 8/2006 | Kawagoe et al. | 361/91.1 |
| 2010/0133913 A1 * | 6/2010 | Iida | 307/82 |
| 2010/0141215 A1 * | 6/2010 | Takeda | 320/136 |
| 2010/0188044 A1 * | 7/2010 | Yamamoto | 320/118 |
| 2010/0239896 A1 * | 9/2010 | Kanno | 429/92 |
| 2010/0244847 A1 * | 9/2010 | Kudo et al. | 324/433 |
| 2010/0270973 A1 * | 10/2010 | Miyazaki et al. | 320/120 |

FOREIGN PATENT DOCUMENTS

| JP | 2002-186173 | 6/2002 |
| JP | 2005-229742 | 8/2005 |
| JP | 2006-262574 | 9/2006 |
| JP | 2007-195303 | 8/2007 |
| JP | 2007-228665 | 9/2007 |
| JP | 2008-61306 | 3/2008 |

OTHER PUBLICATIONS

"A Guide to the Safe Use of Secondary Lithium Ion Batteries in Notebook-type Personal Computers," 2007, Japan Electronics and Information Technology Industries Association and Battery Association of Japan.

* cited by examiner

*Primary Examiner* — Samuel Berhanu
*Assistant Examiner* — Jerry D Robbins
(74) *Attorney, Agent, or Firm* — Cooper & Dunham LLP (57) ABSTRACT

A voltage monitor semiconductor device to monitor voltages of multiple rechargeable devices to output a detection result signal to indicate overcharge, over-discharge, or excess-current, the voltage monitor semiconductor device including multiple voltage input terminals, corresponding to the multiple rechargeable devices, to monitor the voltages of the corresponding rechargeable devices as monitor voltages; and a test signal generation circuit to generate a first test signal that inverts when at least one of the monitor voltages falls below a predetermined first threshold voltage that is not used normally as an abnormal state.

7 Claims, 6 Drawing Sheets

VOLTAGE MONITOR SEMICONDUCTOR DEVICE, BATTERY PACK, AND ELECTRONIC DEVICE EMPLOYING BATTERY PACK

CROSS-REFERENCE TO RELATED APPLICATION

This patent application is based on and claims priority pursuant to 35 U.S.C. §119 to Japanese Patent Application No. 2011-054163, filed on Mar. 11, 2011 in the Japan Patent Office, the entire disclosure of which is hereby incorporated by reference herein.

BACKGROUND

1. Technical Field

The present disclosure relates to a voltage monitor semiconductor device for a storage device, a battery pack for a secondary battery, and an electronic device incorporating the battery pack. More particularly, the present disclosure relates to a voltage monitor semiconductor device to protect a lithium-ion battery, an electrical double-layer capacitor, or the like built into a secondary battery pack used in mobile electronic devices from abnormal conditions such as over-charge, over-discharge, and excess-current; a battery pack incorporating the semiconductor device; and an electronic device incorporating the battery pack.

2. Description of the Background Art

Typically, secondary batteries (rechargeable batteries) consisting of a high-capacity battery such as a lithium-ion battery have come to be widely used in portable electronic devices such as mobile phones. These portable electronic devices incorporate a battery pack having a charge-discharge detection circuit and/or an over-discharge detection circuit to protect the secondary battery. To control the charge and discharge of the secondary battery, there is generally employed a structure in which, in order to protect the secondary battery from being over-charged, over-discharged, or excess current, a protection switch is turned off after a given delay time when a detection terminal voltage equal to or higher than a predetermined level is detected, thereby prohibiting charging.

In addition, in known voltage monitor semiconductor devices, testing of integrated circuits (IC) or a substrate on which the IC is mounted is generally conducted by shortening the delay time, because the delay time for detecting abnormal state, for example, the overcharge, the over-discharge, and the excess current in a protection circuit is too long. This is accomplished, for example, by providing a test terminal and applying a voltage to the test terminal, to switch from a normal state to a test state.

For example, JP-3794547-B discloses a semiconductor device, serving as the charge-discharge protection circuit in the battery pack, that can shorten a test time using a test terminal, assure a long delay time, and changes from a detection state to a non-detection state when repetition of the detection state and non-detection state is necessary (when a tested circuit is included). More specifically, the charge-discharge protection circuit includes the test terminal, a comparator, and switching elements including two inverters whose thresholds are different from each other, a single NOR gate, and three NAND gates. The charge-discharge protection circuit can cause the delay time of the output of the comparator to switch among a normal delay mode, a delay mode shorten mode, and a non-delay time mode, by selecting three voltage levels Low, Medium, and High, as input of the test terminal, using the switching elements. In particular, a method in which the delay time is shortened by applying the voltage to the test terminal is disclosed.

In addition, in proposed in JP-2006-262574-A, a reduction technique to shorten the delay times of respective detection signals for a discharging excess current state and a charging excess current state, which has conventionally been used for testing, is used as the protection feature for normal charging and normal discharging. More specifically, in addition to a charging excess current detection circuit, a discharging excess current detection circuit, a delay circuit, and a discharging path shield circuit including a discharge control FET, a secondary battery protection circuit includes a reduction circuit and an error detection circuit. The reduction circuit shortens the delay time in the delay circuit. The error detection circuit detects that a voltage Vt of a charger negative terminal becomes higher than a preset threshold voltage Vh for detecting error discharging state that is much higher than a high threshold voltage in normal state Vh (Vt>>Vh) or becomes lower than a preset threshold voltage Vj for detecting error discharging state that is much lower than a low threshold voltage in the normal state Vj (Ve<<Vj). When the error detection circuit detects the error charging state or the error discharging state, the circuit is activated to quickly cut off the charging current path and the discharging current path. In particular, using the excess current detection terminal, the delay time from detection of the overcharge and the over-discharge to stopping charging and discharging to the secondary battery is shortened.

However, chip size increases if it is necessary to provide the test terminal, thereby increasing its cost. Alternatively, in a configuration in which the number of terminals in the circuit is limited, the test terminal cannot be provided. In order to solve this problem, in protection circuits having only the power supply terminal, voltage detection terminal, and the output terminal, it is a known technique to change the state from a normal state and latch it at a test state, by increasing the voltage at the power supply terminal to be a predetermined amount greater than the voltage at the voltage detection terminal or by inputting a pulse voltage to the power supply terminal.

JP-2007-228665-A proposes a charge-discharge protection circuit that can switch between a normal state and a test state without providing an external test terminal. More specifically, the charge-discharge protection circuit can switch between a normal state and the test state during which the charge-discharge control circuit is evaluated, based on whether or not an external voltage is supplied to the output terminal of the charge-discharge protection circuit used for the secondary battery. In addition, using a fuse, two test delay time reduction modes in the test state can be realized. In particular, the switch is made from the normal state to the test state by applying a voltage differing from the voltage in the normal state to the output terminal.

Alternatively, in JP-2007-195303-A, a charge-discharge control circuit that includes a delay circuit installed in an over-discharge detection circuit or an overcharge detection circuit can change the delay time in the detection circuits and shorten the test time, without providing a control terminal. More specifically, the charge discharge control circuit includes a voltage detection circuit that detects that a detection voltage exceeds a rated voltage between a power supply terminal of the charge-discharge control circuit and a power supply detection terminal. The delay time of the internal control circuit decreases based on the detection signal of the voltage detection circuit. In particular, when a difference between the voltage at the power supply terminal and the voltage at the voltage detection terminal exceeds a rated value, the switch is made from the normal state to the test state.

In addition, in JP-2008-61306-A, a charge-discharge control circuit includes a test circuit to switch between the normal state and the abnormal state, an overcharge detection circuit to receive a detection signal, and a delay circuit to set the delay time. In this circuit, after the test state, in order to reliably return to the normal state by releasing the test state, the delay circuit changes the delay time from the test state to the normal state in a state in which a predetermined time elapses after the test circuit is brought into the test state from the normal state, or in a state in which a predetermined time elapses after the overcharge detection circuit detects the detection signal in the test state. In particular, when the circuit mistakenly is brought into the test state because of external noise or the like, the normal state is resumed after a predetermined time has elapsed.

In above-described examples, in the protection circuits having only the power supply terminal, the voltage detection terminal, and the output terminal, it is known that the switch is made from the normal state and latched at the test state by increasing a voltage at the power supply terminal to be a predetermined amount greater than a voltage detection terminal or inputting a pulse voltage to the power supply terminal.

However, in these examples, in case in which the external noise outside of the IC mistakenly latches to the test state, a latch recovery countermeasure is required, which is complicated.

BRIEF SUMMARY

In one aspect of this disclosure, there is a provided a voltage monitor semiconductor device to monitor voltages of multiple rechargeable devices and output a detection result signal to indicate abnormal state. The voltage monitor semiconductor device includes multiple voltage input terminals and a test signal generation circuit. The multiple voltage input terminals correspond to the multiple rechargeable devices and monitor the voltages of the corresponding rechargeable devices as monitor voltages. The test signal generation circuit generates a first test signal when at least one of the monitor voltages falls below a predetermined first threshold voltage that is not used normally.

In another aspect of this disclosure, there is a provided a voltage monitor semiconductor device to monitor voltages of multiple rechargeable devices to output a detection result signal to indicate abnormal state. The voltage monitor semiconductor device includes multiple voltage input terminals and a test signal generation circuit. The multiple voltage input terminals correspond to the multiple rechargeable devices and monitor the voltages of the corresponding rechargeable devices as monitor voltages. The test signal generation circuit generates a first test signal when at least one of the monitor voltages exceeds a predetermined third threshold voltage that is not used normally.

In yet another aspect of this disclosure, there is a provided an electronic device employing a battery pack and a load or a charger. The battery pack includes multiple rechargeable devices and a voltage monitor semiconductor device to monitor voltages of the multiple rechargeable devices to output a detection result signal to indicate abnormal state. The voltage monitor semiconductor device includes multiple voltage input terminals and a test signal generation circuit. The multiple voltage input terminals correspond to the multiple rechargeable devices and monitor the voltages of the corresponding rechargeable devices as monitor voltages. The test signal generation circuit generates a first test signal that inverts when at least one of the monitor voltages falls below a predetermined first threshold voltage that is not used normally.

BRIEF DESCRIPTION OF THE DRAWINGS

The aforementioned and other aspects, features and advantages are better understood by reference to the following detailed description when considered in connection with the accompanying drawings, wherein.

DETAILED DESCRIPTION OF PREFERRED EMBODIMENTS

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result. Referring now to the drawings, wherein like reference numerals designate identical or corresponding parts throughout the several views, particularly to FIGS. 1 through 7, an error amplification circuit according to an illustrative embodiment is described.

(First Embodiment)

Figure 1:
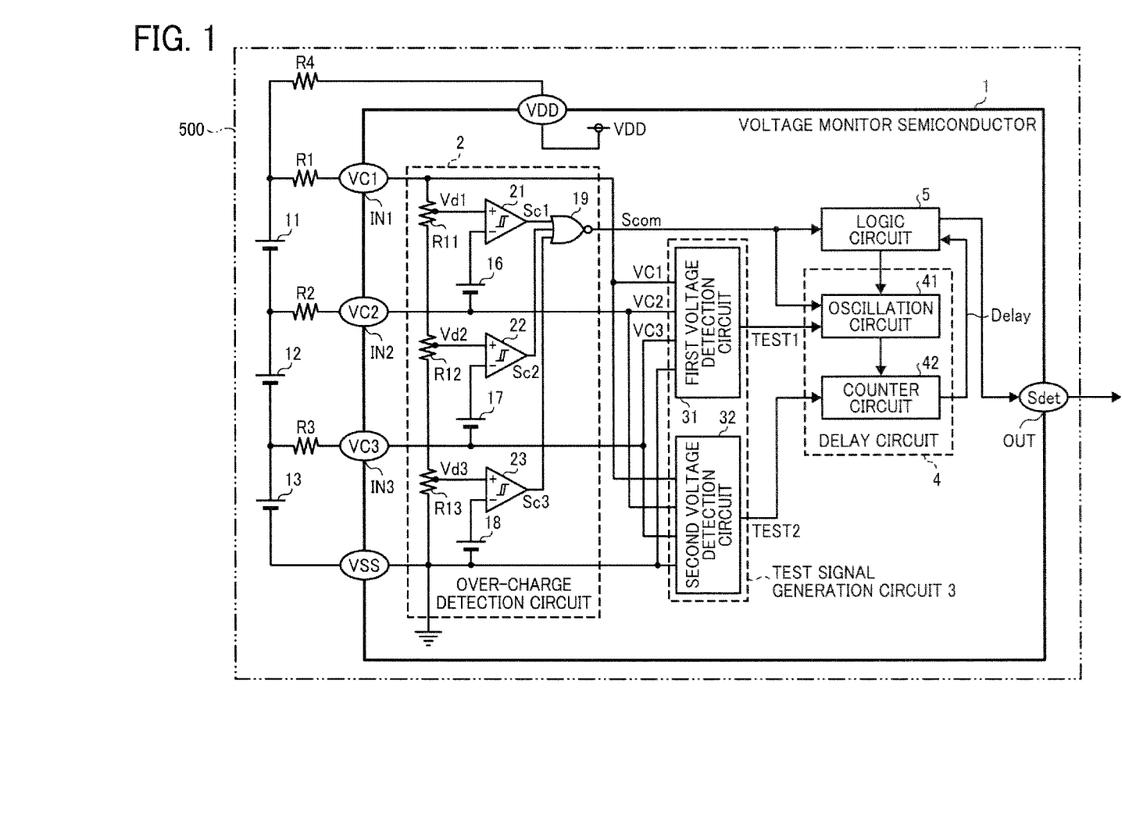
FIG. 1 is a circuit diagram illustrating a voltage monitor semiconductor device according to a first embodiment of the present disclosure.

FIG. 1 is a circuit diagram illustrating a voltage monitor semiconductor device 1, according to a first embodiment. The voltage monitor semiconductor device 1, three rechargeable batteries 11, 12, and 13, and four resistors R4, R1, R2, and R3 are included in a battery pack 500. The voltage monitor semiconductor device 1 functions as a secondary battery protection circuit or a charge-discharge control circuit.

In FIG. 1, the voltage monitor semiconductor device 1 includes an overcharge detection circuit 2, a test signal generation circuit 3 including a first voltage detection circuit 31 and a second voltage detection circuit 32, a delay circuit 4 including an oscillation circuit 41 and a counter circuit 42, and a logic circuit 5. The overcharge detection circuit 2 includes dividing resistors R11, R12, and R13, reference voltage sources 16, 17, and 18, comparators 21, 22, and 23, and a NOR gate 19. The voltage monitor semiconductor device 1 outputs a detection result signal Sdet through an output terminal OUT. In the voltage monitor semiconductor device 1, voltage input terminals IN1, IN2, and IN3 monitor the voltages of the batteries 11, 12, and 13 as monitor voltages VC1, VC2, and VC3.

As illustrated in FIG. 1, the three rechargeable batteries 11, 12, and 13 are connected to each other in a cascade connection with the voltage monitor semiconductor device 1. The rechargeable battery 11 supplies the maximum voltage in the rechargeable batteries 11, 12, and 13. A voltage at a positive electrode of the rechargeable batteries 11 is applied to the voltage monitor semiconductor device 1 through the resistor R4 as a power supply voltage VDD and is also applied to the overcharge detection circuit 2 through the resistor R1 as a monitor voltage VC1. A voltage at a positive electrode of the rechargeable battery 12 is applied to the overcharge detection circuit 2 through the resistor R2 as a monitor voltage VC2. A voltage at a positive electrode of the rechargeable battery 13 is applied to the overcharge detection circuit 2 through the resistor R3 as a monitor voltage VC3. A negative electrode of the rechargeable battery 13 is connected to ground as a ground voltage Vss.

In the overcharge detection circuit 2, the monitor voltage VC1 is directly input to the first voltage detection circuit 31 and the second voltage detection circuit 32 and is divided by the dividing resistor R11 for output to the comparator 21 as a divided voltage Vd1. The comparator 21 compares the divided voltage Vd1 and a reference voltage generated in the reference voltage source 16 and outputs a comparison signal Sc1 indicating the comparison result to the logic circuit 5 and the delay circuit 4 via the NOR gate 19. The monitor voltage VC2 is directly input to the first voltage detection circuit 31 and the second voltage detection circuit 32 and is divided by the dividing resistor R12 for output to the comparator 22 as a divided voltage Vd2. The comparator 22 compares the divided voltage Vd2 and a reference voltage generated in the reference voltage source 17 and outputs a comparison signal Sc2 indicating the comparison result to the logic circuit 5 and the delay circuit 4 via the NOR gate 19. The monitor voltage VC3 is directly input to the first voltage detection circuit 31 and the second voltage detection circuit 32 and is divided by the dividing resistor R13 for output to the comparator 23 as a divided voltage Vd3. The comparator 23 compares the divided voltage Vd3 and a reference voltage generated in the reference voltage source 18 and outputs a comparison signal Sc3 indicating the comparison result to the logic circuit 5 and the delay circuit 4 via the NOR gate 19.

For example, when a cell voltage of at least one rechargeable batteries 11, 12, and 13 exceeds an overcharge detection voltage that is set in advance, that is, at least one of the comparison signals Sc1, Sc2, and Sc3 is high, the NOR gate 19 of the overcharge detection circuit 2 inverts an output signal (comparison result signal) Scom from high level to low level and outputs the low-leveled the comparison result signal Scom to the logic circuit 5 and the oscillation circuit 41. At this time, the oscillation circuit 41 in the delay circuit 4 starts activating, and a counter circuit 42 start counting. Then, after the counter circuit 42 counts a preset delay time, the counter circuit 42 causes the logic circuit 5 to turn the detection result signal Sdet from low level to high level.

In the present embodiment, a state in which at least one of the rechargeable batteries 11, 12, and 13 is lower than a first threshold voltage Vth1 is called as a first test state. The first threshold voltage Vth1 is an abnormal value, namely, the value that is not used usually, for example, 0 V, or −0.1 V. In addition, a state in which at least one of the rechargeable batteries 11, 12, and 13 is lower than a second threshold voltage Vth2 that is lower than the first threshold voltage Vth1 is called as a second test state. The second threshold voltage Vth2 is an abnormal value, namely, the value that is not used usually, for example, a negative value −0.1 V to −0.2V or −0.2V to −0.3V.

Alternatively, the first threshold voltage Vth1 and the second threshold value Vth2 may be set to be lower than a lower limit discharging voltage, for example, that is defined by a lower limit value of a single cell voltage that the respective single cells are allowed in terms of safety.

In the signal generation circuit 3, the first voltage detection circuit 31 outputs a first test signal TEST1 indicating the first test state in which the voltage of at least one of the three rechargeable batteries 11, 12, and 13 becomes equal to or falls below a first threshold value to the oscillation circuit 41 of the delay circuit 4. In addition, the second voltage detection circuit 32 outputs a second test signal TEST2 indicating the second test state in which the at least one of the three rechargeable batteries 11, 12, and 13 falls below the second threshold voltage to the counter circuit 42 of the delay circuit 4.

In the present embodiment, the first test signal TEST1 means a voltage (signal), which inverts from that in normal state, output from the first signal detection circuit 31. While the voltage inverting from that in the normal state is output from the first voltage detection circuit 31 to the oscillation circuit 41 of the delay circuit 4, a delay time (a first shortened delay time) from the detection of the overcharge to inversion of the detection result signal Sdet can be shortened to one-fiftieth the delay time in the normal state. For example, setting the overcharge delay time to 1 second when the signal from the first voltage detection circuit 31 is high (normal state), the overcharge delay time is set to one-fiftieth (1/50) of a second when the signal from the first voltage detection circuit 31 is low, that is, the first test signal TEST1 is output.

In addition, the second test signal TEST2 means a voltage (signal), which inverts from that in normal state, output from the second signal detection circuit 32. While the voltage inverting from that in the normal state is output from the second voltage detection circuit 32 to the counter 42 of the delay circuit 4, a delay time (a second shortened delay time) from the detection of the overcharge to inversion of the detection result signal Sdet can be shortened to several millisecond. The several milliseconds are much shorter than one-fiftieth (1/50) of a second.

For example, in a state in which the battery 11 is externally controlled to be lower than the first threshold value Vth1 that is not used normally, a delay time from detection of the overcharge as the abnormal state in the batteries 12 and 13 except the battery 11 to inversion of the detection result signal Sdet is shortened to the first shortened time, compared to the delay time in the normal state.

In addition, in a state in which the battery 11 is externally controlled to be lower than the second threshold value Vth2 that is not used normally, a delay time from detection of the overcharge as the abnormal state in the batteries 12 and 13 except the battery 11 to inversion of the detection result signal Sdet is shortened to a second shortened time, compared to the delay time in the normal state.

Figure 2:
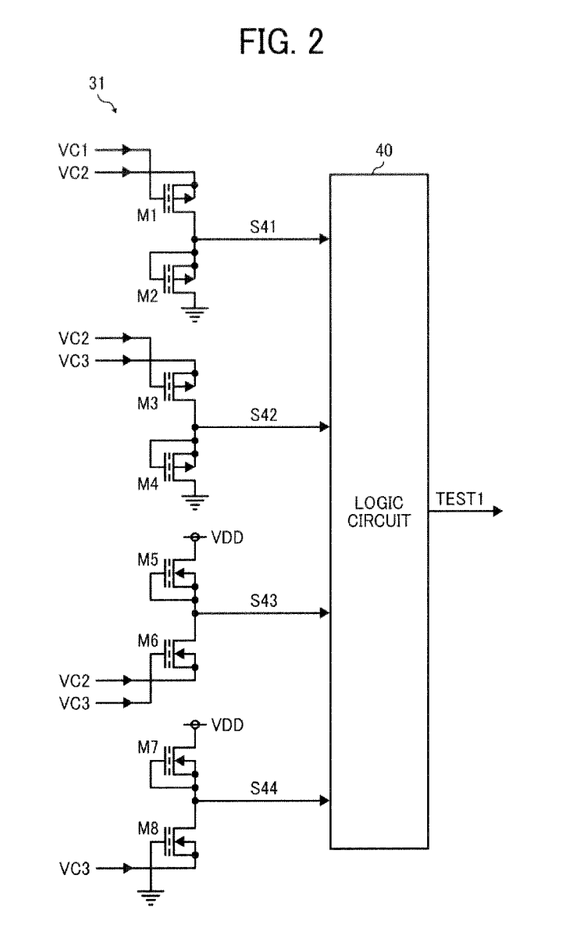
FIG. 2 is a circuit diagram illustrating the configuration of a first voltage detection circuit included in the voltage monitor semiconductor device shown in FIG. 1.

Herein, configurations of the test signal generation circuit 3 and the delay circuit 4 are described in detail below. FIG. 2 is a circuit diagram illustrating the configuration of the first voltage detection circuit 31 shown in FIG. 1. As illustrated in FIG. 2, the first voltage detection circuit 31 includes NMOS depletion-type transistors M1 through M8, and a logic circuit 40.

The first threshold voltage Vth1 is determined by a ratio of gate widths and gate lengths of the PMOS depletion-type transistor pairs "M1 and M2" and "M3 and M4", and the NMOS depletion-type transistor pairs "M5 and M6" and "M7 and M8".

When a difference obtained by subtracting the monitor voltage VC2 from VC1 is lower than or equal to the first threshold voltage Vth1 (VC1-VC2≤Vth1), the PMOS transistor pair M1 and M2 outputs a high-leveled detection signal S41 to the logic circuit 40. When a difference obtained by subtracting the monitor voltage VC3 from VC2 is lower than or equal to the first threshold voltage Vth1(VC2-VC3≤Vth1), the PMOS transistor pair M3 and M4 output a high-leveled detection signal S42 to the logic circuit 40. In addition, when the difference obtained by subtracting the monitor voltage VC3 from VC2 is lower than or equal to the first threshold voltage Vth1 (VC2-VC3≤Vth1), the NMOS transistor pair M5 and M6 outputs a low-leveled detection signal S43 to the logic circuit 40. When a difference obtained by subtracting the voltage Vss from the monitor voltage VC3 is lower than or equal to the first threshold voltage Vth1(VC3-Vss≤Vth1), the NMOS transistor pair M7 and M8 outputs a low-leveled detection signal S44 to the logic circuit 40.

The reason why the first voltage detection circuit 31 includes the two circuits to compare the monitor voltage VC2 with the monitor voltage VC3 to generate the detection signals S42 and S43 that, in a case in which the circuit is transit to the first test mode when two rechargeable batteries become short-circuits, the circuit generating the detection signal S42 is not operated when the battery circuit 13 is short-circuit and the circuit generating the detection signal S43 is not operated when the battery circuit 11 is short-circuit.

In a state in which the detection signals S41 or S42 is high level, or the detection signals S43 or S44 is low level, the logic circuit 40 detects that state is changed from the normal state to the first test state and generates the low-leveled signal as the first test signal TEST1.

Herein, as an alternative configuration of the first voltage detection circuit 31, two inverters may be provided in subsequent stages of the Nch transistor pairs M5 and M6, M7 and M8, respectively. When the difference obtained by subtracting the monitor voltage VC3 from VC2 is lower than or equal to the first threshold voltage Vth1 (VC2-VC3≤Vth1), the NMOS transistor pair M5 and M6 outputs a low-leveled signal, and then, the inverter inverts it and outputs a high-leveled detection signal S43 to the logic circuit 40. When a difference obtained by subtracting the voltage Vss from the monitor voltage VC3 is lower than or equal to the first threshold voltage Vth1(VC3-Vss≤Vth1), the NMOS transistor pair M7 and M8 outputs a low-leveled signal, and then, the inverter inverts it and outputs a high-leveled detection signal S44 to the logic circuit 40. In this configuration, in a state in which at least one of the detection signals S41, S42, S43, and S44 is high, the logic circuit 40 detects that state is changed from the normal state to the first test state and generates the low-leveled signal as the first test signal TEST1.

In addition, as a yet alternative configuration of the first detection circuit 31, two inverters may be provided in subsequent stages of the Pch transistor pair M1 and M2, and M3 and M4, respectively. When a difference obtained by subtracting the monitor voltage VC2 from VC1 is lower than or equal to the first threshold voltage Vth1 (VC1-VC2≤Vth1), the PMOS transistor pair M1 and M2 outputs a high-leveled signal, and then, the inverter inverts it and outputs a low-leveled detection signal S41 to the logic circuit 40. When a difference obtained by subtracting the monitor voltage VC3 from VC2 is lower than or equal to the first threshold voltage Vth1(VC2-VC3≤Vth1), the PMOS transistor pair M3 and M4 outputs a high-leveled signal and then, the inverter inverts it and outputs a low-leveled detection signal S42 to the logic circuit 40. In this configuration, in a state in which at least one of the detection signals S41, S42, S43, and S44 is low, the logic circuit 40 detects that state is changed from the normal state to the first test state and generates the low-leveled signal as the first test signal TEST1.

In addition, the second voltage detection circuit 32 is achieved in the similar configuration of the first voltage detection circuit 31. In the second voltage detection circuit 32, the second threshold value Vth2 that is lower than the first threshold value Vth1 is made by changing the gate widths and the gate lengths of the PMOS depletion-type transistor pairs "M1 and M2" and "M3 and M4", and the NMOS depletion-type transistor pairs "M5 and M6" and "M7 and M8".

In the present embodiment, the transistors M1, M2, M3, and M4 are constituted by PMOS depletion-type transistors, and the transistors M5, M6, M7, and M8 are constituted by NMOS depletion-type transistors; however, the transistors M1, M2, M3, and M4 may be constituted by NMOS depletion-type transistors, and the transistors M5, M6, M7, and M8 may be constituted by PMOS depletion-type transistors.

Alternatively, the first threshold voltage Vth1 and the second threshold voltage Vth2 may be made by comparators.

In addition, the logic circuit 40 may not change state from normal state to the first test mode or the second test mode when at least one of the difference obtained by subtracting the monitor voltage VC2 from VC1 (VC1-VC2), the difference obtained by subtracting the monitor voltage VC3 from VC2 (VC2-VC3), and the difference obtained by subtracting the voltage Vss from the monitor voltage VC3 (VC3-Vss) is lower than or equal to the first threshold voltage or the second threshold voltage but change state from normal state to the first test mode or the second test mode only after at least two of the differences (VC1-VC2), (VC2-VC3), and (VC3-Vss) are lower than or equal to the first threshold voltage or the second threshold voltage. That is, the logic circuit 40 may invert the output signal (output the first test signal TEST1 or the second test signal TEST2) only when the multiple batteries fall below the threshold voltage.

Figure 3:
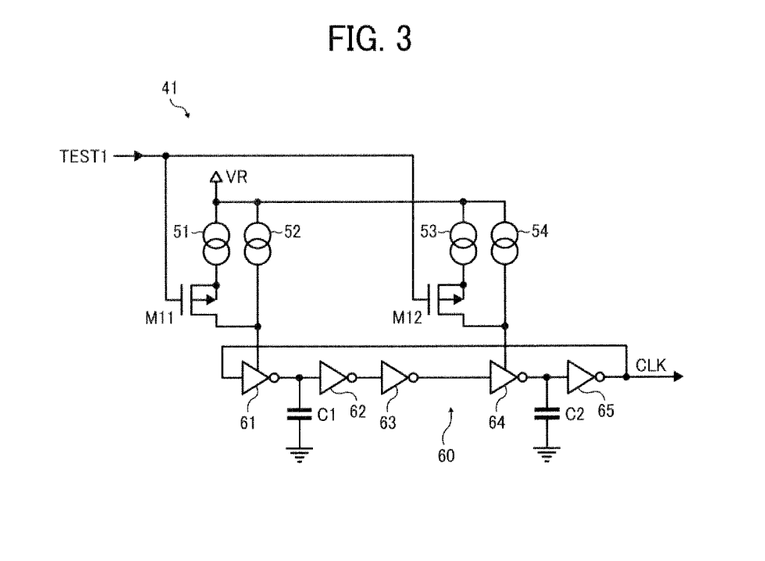
FIG. 3 is a circuit diagram illustrating the configuration of an oscillation circuit of a delay circuit included in the voltage monitor semiconductor device shown in FIG. 1.

FIG. 3 is a circuit diagram illustrating the configuration of the oscillation circuit 41 shown in FIG. 1. In FIG. 3, the oscillation circuit 41 generates a clock signal CLK in response to the first test signal TEST1. The oscillation circuit 41 includes four current sources 51 through 54, MOS transistors M11 and M12 serving as switching elements, and a ring oscillator 60 including five inverters 61 through 65 and two capacitors C1 and C2. The current sources 51 and 53, and the MOS transistors M11 and M12 function as reduction elements.

The oscillation circuit 41 is activated by an interior regulator voltage VR, during normal operation in which the signal from the first voltage detection circuit 31 is high, the MOS transistors M11 and M12 are off state, the two current sources 52 and 54 drive and the oscillation circuit 41 oscillates at an oscillation frequency f0. Conversely, in the first test state in which the signal from the first voltage detection circuit 31 is low (the first test signal TEST1 is input), the MOS transistors M11 and M12 are on state and the four current sources 51 through 54 drive and the oscillation circuit 41 oscillates at an oscillation frequency f1 that is higher than the oscillation frequency f0 (f1>f0). That is, in the first test state, the test can be executed using the clock signal CLK having the high frequency f1.

Thus, in the first test state, by using the clock signal having the frequency f1 that is higher than the frequency f0 in the normal state, the delay time in the first test state can be shortened to the first shorted delay time. The first shortened delay time is shorter than the delay time in the normal time.

Figure 4:
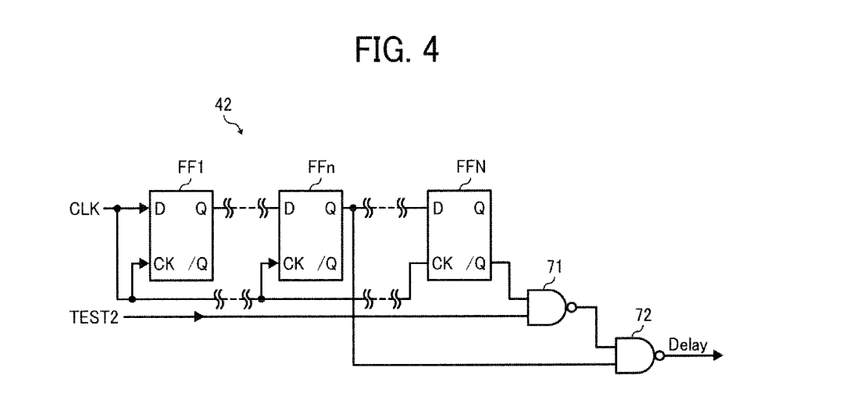
FIG. 4 is a circuit diagram illustrating the configuration of a counter circuit of the delay circuit included in the voltage monitor semiconductor device shown in FIG. 1.

FIG. 4 is a circuit diagram illustrating the configuration of the counter circuit 42 shown in FIG. 1. In FIG. 4, the counter circuit 42 includes multiple delay-type flip-flop circuits FF1 through FFN (N: natural number) connected to each other in a cascade connection and two NAND gates 71 and 72. The NAND gates 71 and 73 function as reduction elements. The clock signal CLK is input to the counter circuit 42 and the counter circuit 42 generates a delay signal Delay.

In normal operation in which the signal from the second voltage detection circuit 32 is high, a time period until an output signal of the final stage of the flip-flop circuit FFN and an output signal of a predetermined stage of the flip-flop FFn (1<n<<N) are inverted is used as the delay time of the delay time signal Delay. In the second test state in which the signal from the second voltage detection circuit 32 is low (the second test signal TEST2 is input), the time period until the flip-flop FFn (1<n<<N) on the way is inverted is used as a second shortened delay time, which dramatically shorten, compared to the delay time in the normal state. That is, when the signal from the second voltage detection circuit 32 is low (the second test signal TEST2 is input), the output signal of the flip-flop FFn (1<n<<N) on the way is skipped (passed through) and is output through the NAND gate 72.

Thus, by skipping the steps of counting number in the counter 42, the delay time in the second test state can be shortened to the second shortened delay time. The second shortened delay time is shorter than the delay time in the normal time. The second shortened delay time is different from the first time. In general, the second shorted delay time is set to be shorter than the first shortened delay time.

Accordingly, in the present embodiment, multiple test signals are generated based on the condition of the cell voltages of the rechargeable batteries, which can easily shorten the respective different delay time respectively, without providing test terminal.

It is to be noted that, the voltage monitor semiconductor device 1 according to this patent specification may be implemented in the battery pack 500 containing multiple secondary cells for installation in various electronic devices, such as mobile phones and laptop personal computers.

As described above, in the present embodiment, when the voltage of the rechargeable device (storage device) such as a battery cell falls below the predetermined threshold voltage that is not used normally, the circuit is changed to the test mode. Accordingly, the delay time can be easily shortened without providing the test terminal, and it is not necessary to generate a pulse signal setting for transiting to the test mode.

In addition, it is not necessary to latch the test mode, or to take countermeasures to return to the normal state in which the circuit is latched due to the external noise. Further, by generating multiple threshold voltages, multiple stages of test modes can be easily generated. Thus, the circuit can be uncomplicated and chip area can be smaller, thereby reducing cost.

Further, the switch is made to the test state only when the cell voltage of the rechargeable batteries becomes to an area that is not usually, mode is easily transited to the test mode. In addition, it is not necessary to provide the test terminal and a circuit to recover, therefore, the circuit size can be eliminated, thereby reducing cost due to narrowing the chip area.

In the present embodiment, although the first shortened delay time in the first test state is shortened by increasing the frequency of the clock signal in the oscillation circuit 41, and the second shortened delay time in the second test state is shortened by skipping the steps of counting number in the counter 42, alternatively, the first shortened delay time in the first test state may be shorted by skipping the steps of counting number in the counter 42 and the second shortened delay time in the second test state may be shortened by increasing the frequency of the clock signal in the oscillation circuit 41. Yet alternatively, the delay times in the first test state and the second test state may be shortened by both increasing the frequency of the clock signal in the oscillation circuit 41 and skipping the steps of counting number in the counter 42.

(Variation)

Figure 5:
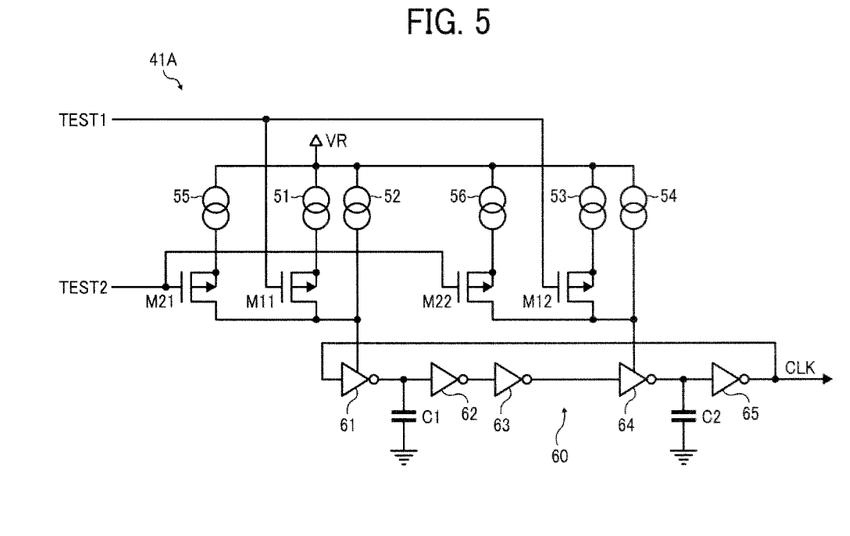
FIG. 5 is a circuit diagram illustrating an oscillation circuit that is a variation of the oscillation circuit shown in FIG. 2.

Next, a variation of an oscillation circuit 41 is described below. In the above-described configuration, the first shortened delay time in the first test state and the second shortened delay time in the second test state is shortened by either increasing the frequency of the clock signal in the oscillation circuit 41 or skipping the steps of counting number in the counter 42. However, in this variation, the delay times in the first test state and the second test state are shortened to the first shortened delay time and the second shortened delay time respectively, by adjusting the frequencies different from each other of clock signal in an oscillation circuit 41A.

FIG. 5 is a circuit diagram illustrating the oscillation circuit 41A that is a variation of the oscillation circuit 41. In FIG. 5, compared to the oscillation circuit 41 shown in FIG. 3, the oscillation circuit 41A further includes a PMOS transistor M21 that is turned on when the signal from the second voltage detection circuit 32 is low (the second test signal TEST2 is input), a current source 55 connected to the PMOS transistor 21, a PMOS transistor M22 that is turned on when the signal from the second voltage detection circuit 32 is low (the second test signal TEST2 is input), and a current source 56 connected to the PMOS transistor 22. The oscillation circuit 41A receives both the first test signal TEST1 and the second test signal TEST2 and generates the clock signal CLK in response to the first test signal TEST1 and the second test signal TEST2.

In the oscillation circuit 41A, when the second test signal TEST2 is input, a driving current to the ring oscillator 60 is set greater, which oscillates at an oscillation frequency f2 that is higher than the frequency f1(f2>f1). That is, the oscillation circuit 41A increases the frequency f2 of the clock signal in the second test mode compared to that of the clock signal in the first test mode, thus, the second shortened delay time is further shorter than the first shortened delay time, and the test time in the second test state can be shortened.

Similarly, two shortened delay times for the first test state and the second test state may be generated using a counter-through circuit that skips the steps of the counting number in a variation of the counter 42.

(Second Embodiment)

In the above-described embodiments, the voltage monitor semiconductor device 1 has a battery system voltage detection function that protects from only over-discharge; however, the present specification is not limited above. In particular, the protection function can detect the abnormal states in combination with, for example, over-discharge, and excess current. More specifically, although the voltage monitor semiconductor device 1 is made to the test states when at least one of the rechargeable batteries becomes lower than the predetermined threshold voltages Vth1 and Vth2 in the first embodiment, the present disclosure is not limited above, and the second embodiment has conversely operation.

Figure 6:
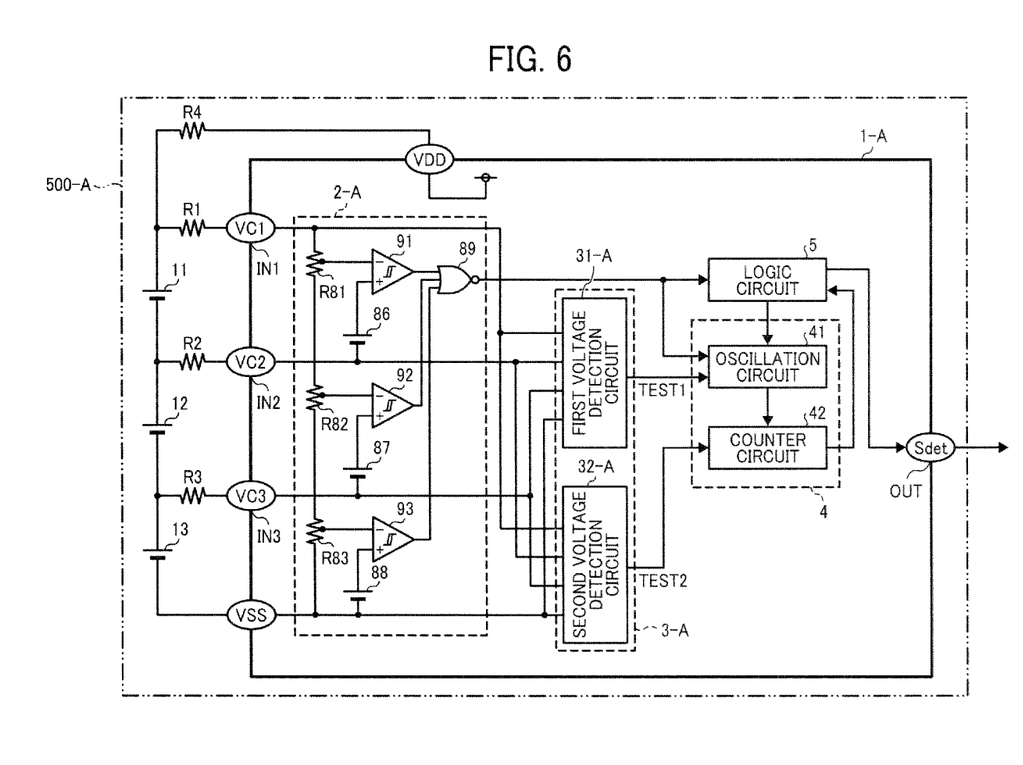
FIG. 6 is a circuit diagram illustrating a voltage monitor semiconductor device according to a second embodiment of the present disclosure.

FIG. 6 is a circuit diagram illustrating a voltage monitor semiconductor device 1-A according to a second embodiment of the present disclosure. The voltage monitor semiconductor device 1-A includes an over-discharge detection circuit 2-A instead of the overcharge detection circuit 2. Similarly to the overcharge detection circuit 2, the overcharge detection circuit 2-A includes dividing resistors R81, R82, and R83, reference voltage sources 86, 87, and 88, comparators 91, 92, and 93, and a NOR gate 89. The voltage monitor semiconductor device 1-A and the batteries 11, 12, and 13 may be implemented in a battery pack 500-A.

Although the dividing voltages detected from the batteries 11, 12, and 13 are input to the non-inverting input terminals of the comparators 21, 22, and 23, and the reference voltages from the reference voltage sources 16, 17, and 18 are connected to the inverting terminals thereof in FIG. 1, the dividing voltages detected from the batteries 11, 12, and 13 are input to inverting input terminals of the comparators 91, 92, and 93, and reference voltages from the reference voltage sources 86, 87, and 88 are connected to non-inverting terminals thereof in FIG. 6. The reference voltages generated in the reference sources 86, 87, and 88 may be equal to or different from that generated in the reference sources 16, 17, and 18.

In the signal generation circuit 3-A, a first voltage detection circuit 31-A outputs a first test signal TEST1 indicating a first test state in which the voltage of at least one of the three rechargeable batteries 11, 12, and 13 becomes equal to or exceeds a third threshold voltage Vth3 to the oscillation circuit 41 of the delay circuit 4. In addition, a second voltage detection circuit 32-A outputs a second test signal TEST2 indicating the second test state in which at least one of the three rechargeable batteries 11, 12, and 13 exceeds a fourth threshold voltage Vth4 to the counter circuit 42 of the delay circuit 4.

In the second embodiment, the voltage monitor semiconductor device 1-A sets the first test state in which at least one of the rechargeable batteries 11, 12, and 13 becomes higher than the third threshold voltage Vth3 that is not used normally (abnormal state) (for example, 4.25 V, 7V or 8V), and sets the second state in which at least one of the rechargeable batteries 11, 12, and 13 becomes higher than the fourth threshold voltage Vth4 that is higher than the third threshold voltage (e.g., 4.5 V to 5.0 V, 8 V, or 10 V).

Herein, the third threshold voltage Vth3 is higher than, for example, an upper limit charging voltage. The upper limit charging voltage is defined by an electrical cell voltage when the battery is charging at the upper limit that the respective single sells are allowed in terms of safety.

It is to be noted that, for ease of explanation and illustration, because other than the difference described above the voltage monitor semiconductor device 1-A of the second embodiment has a configuration similar to the configuration of the voltage monitor semiconductor device 1 in the first embodiment, description and figures of the voltage monitor semiconductor device of the second embodiment are omitted.

As described above, the voltage monitor semiconductor device 1-A according to the second embodiment changes state from normal state to the first test mode or the second test mode, and therefore, the configuration of the second embodiment can achieve effects similar to those of the voltage monitor semiconductor device 1 described above.

(Variation of Second Embodiment)

Herein, although the voltage monitor semiconductor device includes either the overcharge detection circuit 2 or the over-discharge detection circuit 2-A, the voltage monitor semiconductor device in the present variation may include both overcharge detection circuit 2 and over-discharge detection circuit 2-A. In this variation, the voltage monitor semiconductor device can detect the overcharge and the over-discharge and shorten the delay times for respectively.

In this variation, for example, when the battery 11 becomes lower than the first threshold value or the second threshold value, the voltage monitor semiconductor device may mistakenly detect the battery 11 as the over-discharge state, because the first threshold voltage and the second threshold voltage are lower than an over-discharge voltage. In order to solve this problem, it is necessary to prevent detection of the over-discharge state in the battery 11 when the abnormal state (overcharge, over-discharge, or excess current) in the batteries 12 and 13 is detected in the state in which the voltage at the battery 11 becomes lower than the first threshold voltage or the second threshold voltage.

Similarly, for example, when the battery 11 becomes higher than the third threshold value or the fourth threshold value, the voltage monitor semiconductor device may mistakenly detect the battery 11 as the overcharge state, because the third threshold voltage and the second threshold voltage are lower than an over-discharge voltage. In order to solve this problem, it is necessary to prevent detection of the overcharge state in the battery 11 when the abnormal state (overcharge, over-discharge, or excess current) in the batteries 12 and 13 is detected in the state in which the voltage at the battery 11 becomes higher than the third threshold voltage or the fourth threshold voltage.

Therefore, in the voltage monitor semiconductor device including both the overcharge detection circuit 2 and over-discharge detection circuit 2-A, an additional logic circuit is provided to prevent the detection of the over-discharge of the battery 11 that is externally controlled to be lower than the first threshold voltage or the second threshold voltage as the abnormal state when at least one of the battery (for example, battery 11) is externally controlled to be lower than the first threshold voltage or the second threshold voltage and the voltage monitor semiconductor device enters the first test state or the second test state. The additional logic circuit shorten the delay time for detecting the abnormal state in the batteries 12 and 13 except the at least one of the rechargeable device (battery 11) to the first shortened delay time or the second shortened delay time.

This additional logic circuit also prevents the detection of the overcharge of the battery 11 that is externally controlled to be lower than the first threshold voltage or the second threshold voltage as the abnormal state when at least one of the battery (for example, battery 11) is externally controlled to be lower than the first threshold voltage or the second threshold voltage and the voltage monitor semiconductor device enters the first test state or the second test state. The additional logic circuit shorten the delay time for detecting the abnormal state in the batteries 12 and 13 except the at least one of the rechargeable device (battery 11) that is externally controlled to be higher than the third threshold voltage or the fourth threshold voltage to the first shortened delay time or the second shortened delay time.

(Third Embodiment)

Figure 7:
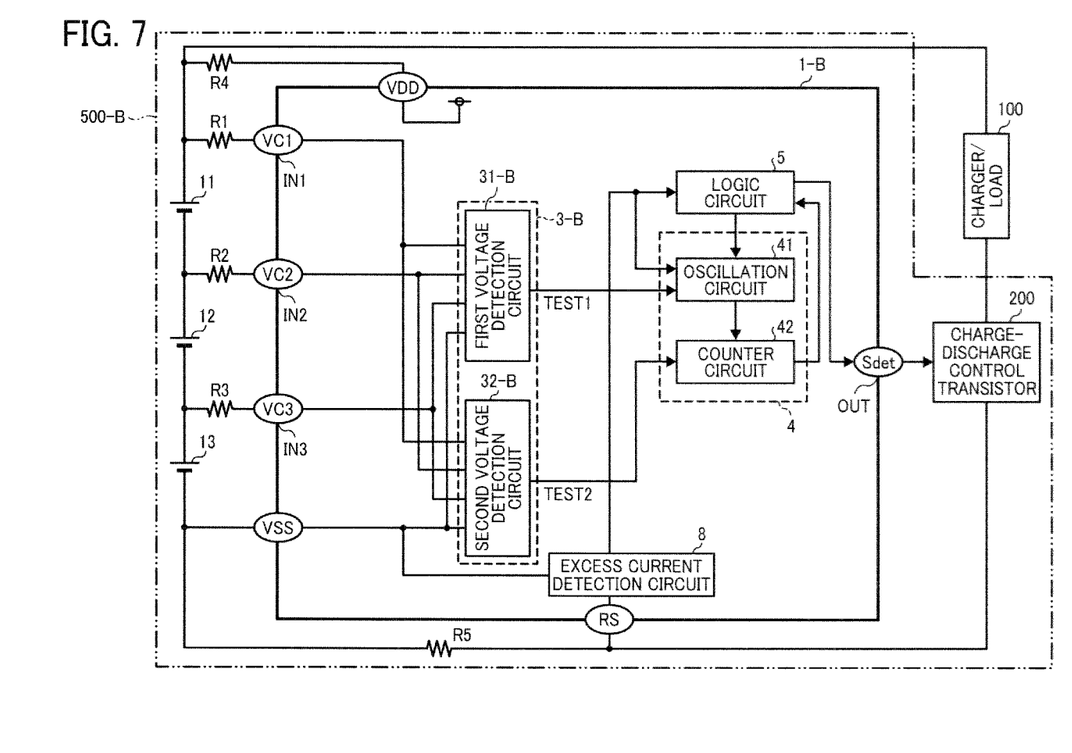
FIG. 7 is a circuit diagram illustrating a voltage monitor semiconductor device according to a third embodiment of the present disclosure.

FIG. 7 is a circuit diagram illustrating a voltage monitor semiconductor device 1-B according to a third embodiment of the present disclosure. The voltage monitor semiconductor device 1-B includes an excess-current detection circuit 8 instead of the overcharge detection circuit 2 or the over-discharge detection circuit 2-A.

In FIG. 7, the positive electrode of the battery 11 is connected to a positive electrode of a charger or load 100. The negative electrode of the battery 13 is connected to a charge-discharge control transistor 200 via a resistor R5, is connected to the detection circuit 3 via the terminal VSS, and is connected to the current detection circuit 8 via the resistor R5 and a terminal RS. An output of the excess-current detection circuit 8 is connected to the logic circuit 5. The voltage monitor semiconductor device 1-B, the resistor R5, the charge-discharge control transistor 200, and the batteries 11, 12, and 13 may be implemented in a battery pack 500-B.

The excess-current detection circuit 8 includes an abnormal battery detection circuit and a pull-up transistor. When the excess-current detection circuit 8 detects that the charge or load 100 output an excess current, for example, exceeding a rated output current or outputting short-circuit current, an output signal from the excess-current detection circuit 8 is inverted (high level to low level), and the inverted output signal is output to the oscillation circuit 41 of the delay circuit 4. It is to be noted that an on-resistance of the charge-discharge control transistor 200 may function as a resistor instead of the resistor R5.

(Variation of Third Embodiment)

As described above, although the voltage monitor semiconductor device 1-B includes the excess-current detection circuit 8, the voltage monitor semiconductor device may include both excess-current detection circuit 8 and the overcharge detection circuit 2, or both excess-current detection circuit 8 and the over-discharge detection circuit 2-A, or all of excess-current detection circuit 8, the overcharge detection circuit 2, and the over-discharge detection circuit 2-A. In this case, the voltage monitor semiconductor device can detect the excess-current and overcharge, excess-current and over-discharge, and excess-current, overcharge, and over-discharge, and shorten the delay time for respectively.

In above-described embodiments and variations, the first test state and the second test state may be assigned to two states chosen from the states in which the voltage falls below the first threshold voltage, the voltage falls below the second threshold voltage, the voltage exceeds the third threshold voltage, and the voltage exceeds the fourth threshold voltage.

In addition, the voltage monitor semiconductor device makes two test states including the first test state and the second test state, the present disclosure is not limited as described above, that is, the voltage monitor semiconductor device may make more than two test states using the first through fourth threshold voltages.

Furthermore, although the voltage monitor semiconductor device in the above-described embodiment is connected to the three rechargeable batteries 11, 12, and 13, the present disclosure is not limited it; for example, the voltage monitor semiconductor device can be connected to two or at least four rechargeable batteries. Alternatively, although rechargeable batteries are used as storage devices (secondary batteries) in the above-described embodiment, the rechargeable devices are not limited to it; for example, electrical double layer capacitor can be used as the storage devices.

Further, the transistor not limited to the MOS transistor, the transistor may be formed by bipolar transistors.

Numerous additional modifications and variations are possible in light of the above teachings. It is therefore to be understood that, within the scope of the appended claims, the disclosure of this patent specification may be practiced otherwise than as specifically described herein.

What is claimed is:

1. A voltage monitor semiconductor device to monitor voltages of multiple rechargeable devices to output a detection result signal to indicate abnormal state, the voltage monitor semiconductor device comprising:
   multiple voltage input terminals, corresponding to the multiple rechargeable devices, to monitor the voltages of the corresponding rechargeable devices as monitor voltages;
   a test signal generation circuit to generate a first test signal when a difference obtained by subtracting one monitor voltage of one of the rechargeable devices from another monitor voltage of another of the rechargeable devices exceeds a predetermined third threshold voltage that is not used normally,
      wherein the test signal generation circuit generates a second test signal when at least one of the monitor voltages exceeds a predetermined fourth threshold voltage that is higher than the third threshold voltage; and
   a delay circuit to delay the detection result signal at a preset delay time, having a reduction element to shorten the delay time generated in the delay circuit,
   wherein, when the monitor voltage of at least one of the rechargeable device becomes higher than the third threshold voltage, a delay time for detecting abnoimal state in the rechargeable devices except the at least one of the rechargeable device is shortened to a first shortened time, and
   wherein, when the monitor voltage of at least one of the rechargeable device becomes higher than the fourth threshold voltage, a delay time for detecting the abnomial state in the rechargeable devices except the at least one of the rechargeable device is shortened to a second shortened time that is different from the first shortened time.

2. The voltage monitor semiconductor device according to claim 1, wherein the fourth threshold voltage is set to a predetermined positive value that is higher than the third threshold voltage or the fourth threshold voltage is set higher than the higher limit charging voltage that is higher than the third threshold voltage.

3. The voltage monitor semiconductor device according to claim 1, wherein the abnormal state comprises an over-charge state.

4. The voltage monitor semiconductor device according to claim 1, wherein the abnormal state comprises an over-discharge state.

5. The voltage monitor semiconductor device according to claim 1, wherein the abnormal state comprises an excess-current state.

6. The battery pack employing multiple rechargeable devices and the voltage monitor semiconductor device of claim 1.

7. An electronic device comprising:
   a load or a charger and
   a battery pack comprising:
      multiple rechargeable devices; and
      a voltage monitor semiconductor device to monitor voltages of the multiple rechargeable devices to output a detection result signal to indicate overcharge, over-discharge, or excess-current, the voltage monitor semiconductor device comprising:
         multiple voltage input terminals, corresponding to the multiple rechargeable devices, to monitor the voltages of the corresponding rechargeable devices as monitor voltages;

a test signal generation circuit to generate a first test signal that inverts when a difference obtained by subtracting one monitor voltage of one of the rechargeable devices from another monitor voltage of another of the rechargeable devices is less than or equal to a predetermined first threshold voltage that is not used normally, wherein the test signal generation circuit generates a second test signal when at least one of the monitor voltages exceeds a predetermined second threshold voltage that is higher than the first threshold voltage; and a delay circuit to delay the detection result signal at a preset delay time, having a reduction element to shorten the delay time generated in the delay circuit, wherein, when the monitor voltage of at least one of the rechargeable device becomes higher than the first threshold voltage, a delay time for detecting abnormal state in the rechargeable devices except the at least one of the rechargeable device is shortened to a first shortened time, and wherein, when the monitor voltage of at least one of the rechargeable device becomes higher than the predetermined second threshold voltage which is higher than the first threshold voltage, a delay time for detecting the abnormal state in the rechargeable devices except the at least one of the rechargeable device is shortened to a second shortened time that is different from the first shortened time.

* * * * *